(12) United States Patent
Chang et al.

(10) Patent No.: US 12,230,613 B2
(45) Date of Patent: Feb. 18, 2025

(54) VERTICAL SEMICONDUCTOR PACKAGE INCLUDING HORIZONTALLY STACKED DIES AND METHODS OF FORMING THE SAME

(71) Applicant: Taiwan Semiconductor Manufacturing Company Limited, Hsinchu (TW)

(72) Inventors: Jen-Yuan Chang, Hsinchu (TW); Chia-Ping Lai, Hsinchu (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

(21) Appl. No.: 18/230,147

(22) Filed: Aug. 3, 2023

(65) Prior Publication Data

US 2023/0387089 A1 Nov. 30, 2023

Related U.S. Application Data

(62) Division of application No. 17/476,703, filed on Sep. 16, 2021, now Pat. No. 12,009,349.

(60) Provisional application No. 63/166,371, filed on Mar. 26, 2021.

(51) Int. Cl.
*H01L 25/00* (2006.01)
*H01L 25/10* (2006.01)
*H01L 23/00* (2006.01)
*H01L 25/065* (2023.01)

(52) U.S. Cl.
CPC ............ *H01L 25/105* (2013.01); *H01L 25/50* (2013.01); *H01L 24/06* (2013.01); *H01L 24/29* (2013.01); *H01L 24/30* (2013.01); *H01L 25/0657* (2013.01); *H01L 2224/06181* (2013.01); *H01L 2224/2919* (2013.01); *H01L 2224/30181* (2013.01); *H01L 2225/06541* (2013.01)

(58) Field of Classification Search
CPC ........ H01L 25/105; H01L 25/50; H01L 24/06
See application file for complete search history.

(56) References Cited

U.S. PATENT DOCUMENTS

| | | | |
|---|---|---|---|
| 2010/0117209 A1* | 5/2010 | Bezama | H01L 25/065 257/E23.141 |
| 2011/0147911 A1* | 6/2011 | Kohl | H01L 25/0657 438/109 |
| 2018/0040587 A1* | 2/2018 | Tao | H01L 25/0657 |

* cited by examiner

*Primary Examiner* — Trang Q Tran
(74) *Attorney, Agent, or Firm* — The Marbury Law Group, PLLC

(57) ABSTRACT

A semiconductor package includes a first connection die including a semiconductor substrate and an interconnect structure, and a first die stack disposed on the first connection die and including stacked dies, each of the stacked dies including a semiconductor substrate and an interconnect structure including a first connection line that is electrically connected to the interconnect structure of the first connection die. An angle formed between a plane of the first connection die and a plane of each stacked die ranges from about 45° to about 90°.

11 Claims, 12 Drawing Sheets

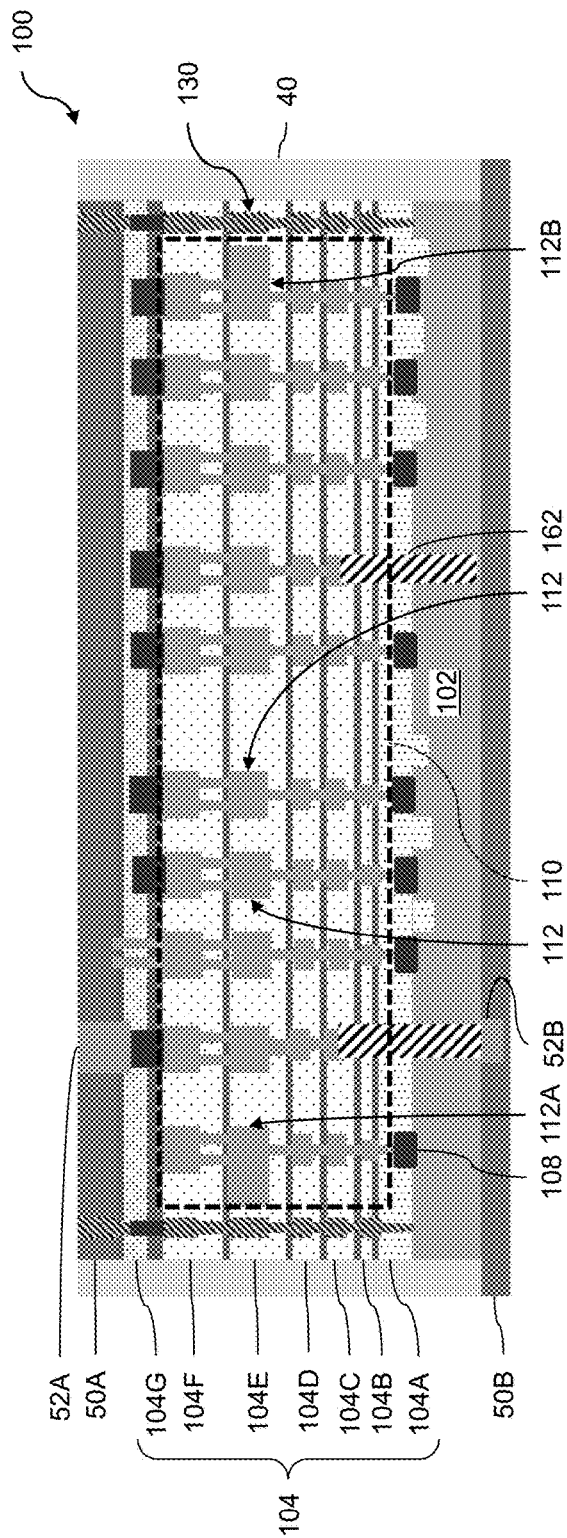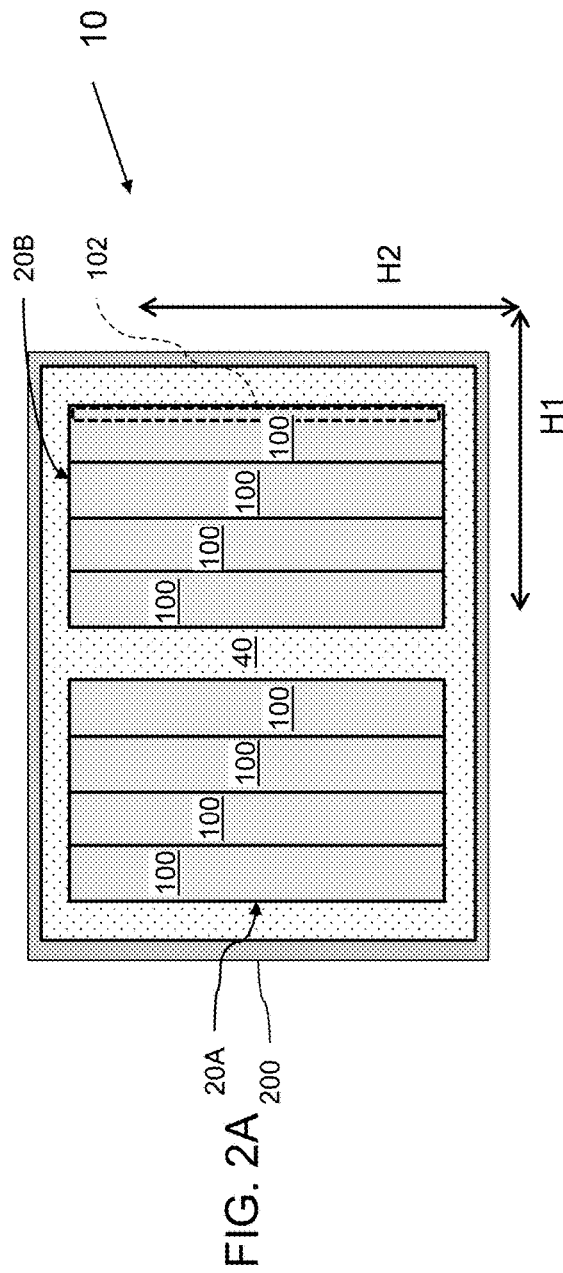
FIG. 1
FIG. 2A

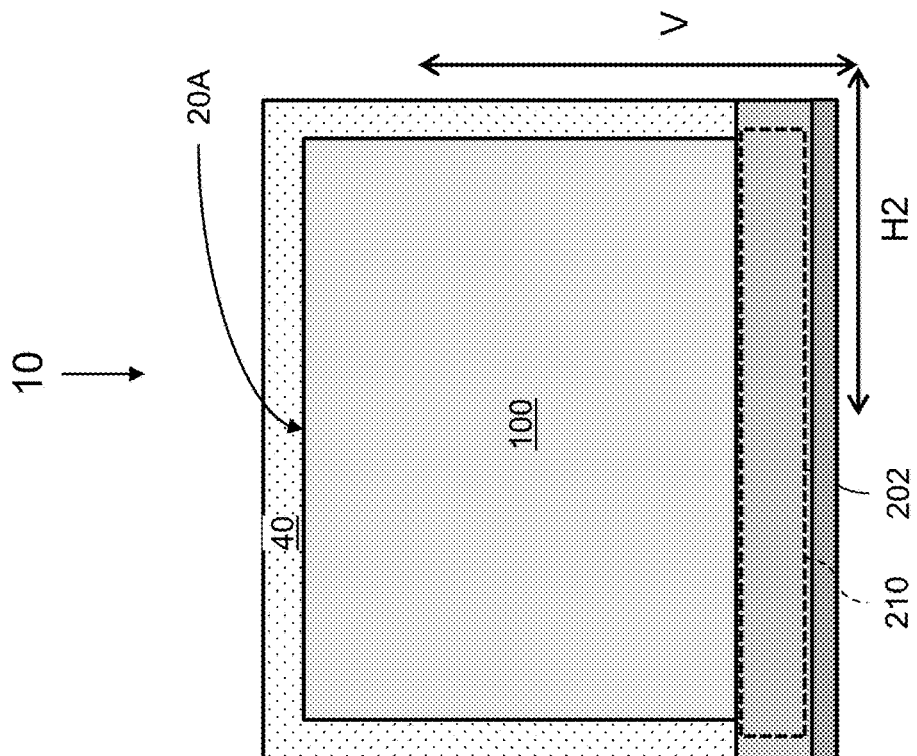
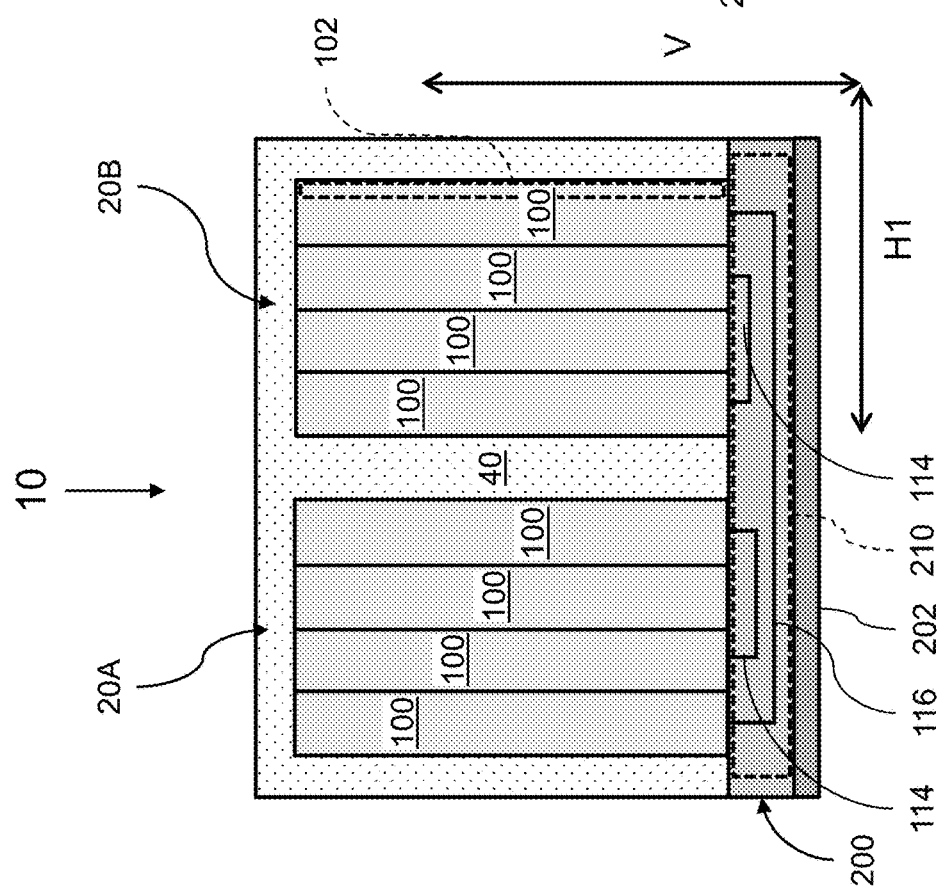

VERTICAL SEMICONDUCTOR PACKAGE INCLUDING HORIZONTALLY STACKED DIES AND METHODS OF FORMING THE SAME

RELATED APPLICATIONS

This application is a divisional application of U.S. patent application Ser. No. 17/476,703 entitled "Vertical Semiconductor Package Including Horizontally Stacked Dies and Methods of Forming the Same," filed on Sep. 16, 2021, which claims priority from U.S. Provisional Patent Application No. 63/166,371 entitled "New Design Vertical SoIC by Hybrid Method" filed on Mar. 26, 2021, the entire contents of both of which are hereby incorporated by reference for all purposes.

BACKGROUND

The semiconductor industry has continually grown due to continuous improvements in integration density of various electronic components, e.g., transistors, diodes, resistors, capacitors, etc. For the most part, these improvements in integration density have come from successive reductions in minimum feature size, which allows more components to be integrated into a given area.

In addition to smaller electronic components, improvements to the packaging of components seek to provide smaller packages that occupy less area than previous packages. Examples of the type of packages for semiconductors include quad flat pack (QFP), pin grid array (PGA), ball grid array (BGA), flip chips (FC), three-dimensional integrated circuits (3DICs), wafer level packages (WLPs), package on package (PoP), System on Chip (SoC) or System on Integrated Circuit (SoIC) devices. Some of these three-dimensional devices (e.g., 3DIC, SoC, SoIC) are prepared by placing chips over chips on a semiconductor wafer level. These three-dimensional devices provide improved integration density and other advantages, such as faster speeds and higher bandwidth, because of the decreased length of interconnects between the stacked chips. However, there are many challenges related to three-dimensional devices.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a cross-sectional view of a semiconductor die 100, according to various embodiments of the present disclosure.

FIG. 2A is a simplified top view of a semiconductor package 10, according to various embodiments of the present disclosure.

FIG. 2B is a simplified view of a first side of the semiconductor package 10 of FIG. 2A.

FIG. 2C is a simplified view of a second side of the semiconductor package 10 of FIG. 2A.

DETAILED DESCRIPTION

Figure 3:
FIG. 3 is a flow diagram showing operations of a method of forming a semiconductor package, according to various embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to de scribe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. Unless explicitly stated otherwise, each element having the same reference numeral is presumed to have the same material composition and to have a thickness within a same thickness range.

A conventional semiconductor package may include a die stack disposed on a second die. In particular, the die stack may include first dies that are aligned in planes parallel to a plane of the second die and vertically stacked on one another. The first dies may include through-silicon via (TSV) structures to electrically connect the first dies to one another. However, in such a configuration non-adjacent first dies cannot be directly electrically connected. As a result, die-to-die resistance may significantly increase as the number of dies in a die stack is increased.

The present disclosure is directed to semiconductor packages including a die stack disposed on a second die. In particular, the die stack may include vertically aligned and horizontally stacked dies that may be directly electrically connected through the second die. As such, die-to-die resistance of the embodiment die stacks may be significantly reduced.

FIG. 1 is a vertical cross-sectional view of a die 100, according to various embodiments of the present disclosure. Referring to FIG. 1, the die 100 may be, for example, an application-specific integrated circuit (ASIC) chip, an analog chip, a sensor chip, a wireless and radio frequency chip, a voltage regulator chip, or a memory chip. In some embodiments, the die 100 may be an active component or a passive component. In some embodiments, the die 100 includes a planar semiconductor substrate 102, a dielectric structure 104, an interconnect structure 110 embedded within the dielectric structure 104, a seal ring 130, and a TSV structure 162.

In some embodiments, the semiconductor substrate 102 may include an elementary semiconductor such as silicon or germanium and/or a compound semiconductor such as silicon germanium, silicon carbide, gallium arsenic, indium arsenide, gallium nitride or indium phosphide. In some embodiments, the semiconductor substrate 102 may be a semiconductor-on-insulator (SOI) substrate. In various embodiments, the semiconductor substrate 102 may take the form of a planar substrate, a substrate with multiple fins, nanowires, or other forms known to people having ordinary skill in the art. Depending on the requirements of design, the semiconductor substrate 102 may be a P-type substrate or an N-type substrate and may have doped regions therein. The doped regions may be configured for an N-type device or a P-type device.

In some embodiments, the semiconductor substrate 102 includes isolation structures defining at least one active area, and a device layer may be disposed on/in the active area. The device layer may include a variety of devices. In some embodiments, the devices may include active components, passive components, or a combination thereof. In some embodiments, the devices may include integrated circuits devices. The devices may be, for example, transistors, capacitors, resistors, diodes, photodiodes, fuse devices, or other similar devices. In some embodiments, the device layer includes a gate structure, source/drain regions, spacers, and the like.

The dielectric structure 104 may be disposed on a front side of the semiconductor substrate 102. In some embodiments, the dielectric structure 104 may include silicon oxide, silicon oxynitride, silicon nitride, a low dielectric constant (low-k) material, or a combination thereof. Other suitable dielectric materials may be within the contemplated scope of disclosure. The dielectric structure 104 may be a single layer or a multiple-layer dielectric structure. For example, as shown in FIG. 1, the dielectric structure 104 may include multiple dielectric layers 104A-104F, which may include a substrate oxide layer 104A, inter-layer dielectric (ILD) layers 104B-104F, and a passivation layer 104G. However, while FIG. 1 illustrates seven dielectric layers, the various embodiments of the present disclosure are not limited to any particular number of layers. More or fewer dielectric layers may be used.

The dielectric structure 104 may be formed by any suitable deposition process. Herein, "suitable deposition processes" may include a chemical vapor deposition (CVD) process, a physical vapor deposition (PVD) process, an atomic layer deposition (ALD) process, a high density plasma CVD (HDPCVD) process, a metalorganic CVD (MOCVD) process, a plasma enhanced CVD (PECVD) process, a sputtering process, laser ablation, or the like.

An interconnect structure 110 may be formed in the dielectric structure 104. The interconnect structure 110 may include metal features 112 disposed in the dielectric structure 104. The metal features 112 may be any of a variety metal lines and via structures that electrically connect the metal lines of adjacent ILD layers 104B-104F. The metal features 112 may include a first connection line 112A that may be used in a die-to-die connection circuit, as discussed in detail below. The metal features 112 may optionally include a second connection line 112B that may be used in a die-to-die connection circuit, as also discussed below.

The interconnect structure 110 may be electrically connected to substrate electrodes 108 disposed on the semiconductor substrate 102, such that the interconnect structure 110 may electrically interconnect connect semiconductor devices formed on the semiconductor substrate 102. In some embodiments, the substrate electrodes 108 may include metal gates of transistors formed in the device layer of the semiconductor substrate 102.

The interconnect structure 110 may be formed of any suitable electrically conductive material, such as copper (Cu), a copper alloy, aluminum (Al), an aluminum alloy, silver (Ag), combinations thereof, or the like. For example, the interconnect structure 110 may preferably include copper at an atomic percentage greater than 80%, such as greater than 90% and/or greater than 95%, although greater or lesser percentages of copper may be used. Other suitable electrically conductive materials are within the contemplated scope of disclosure.

In some embodiments, barrier layers (not shown) may be disposed between the metal features 112 and the dielectric layers of dielectric structure 104, to prevent the material of the metal features 112 from migrating to the semiconductor substrate 102. The barrier layer may include Ta, TaN, Ti, TiN, CoW, or combinations thereof, for example. Other suitable barrier layer materials may be within the contemplated scope of disclosure.

The seal ring 130 may extend around the periphery of the die 100. In other words, the seal ring 130 may be disposed adjacent to side surfaces of the die 100. For example, the seal ring 130 may be disposed in the dielectric structure 104 and may laterally surround the interconnect structure 110. The seal ring 130 may be configured to protect the interconnect structure 110 from contaminant diffusion and/or physical damage during device processing, such as plasma etching and/or deposition processes.

The seal ring 130 may include copper at an atomic percentage greater than 80%, such as greater than 90% and/or greater than 95% although greater or lesser percentages may be used. Other suitable materials for use as the seal ring 130 are within the contemplated scope of disclosure. The seal ring 130 may include conductive lines and via structures that are connected to each other and may be formed simultaneously with the metal features 112 of the interconnect structure 110. The seal ring 130 may be electrically isolated from the metal features 112. The seal ring 130 may be formed from the same materials as the metal features 112 or from different materials.

In some embodiments, the metal features 112 and/or the seal ring 130 may be formed by a dual-Damascene process or by multiple single Damascene processes. Single-Damascene processes generally form and fill a single feature with copper per Damascene stage. Dual-Damascene processes generally form and fill two features with copper at once, e.g., a trench and overlapping through-hole may both be filled with a single copper deposition using dual-Damascene processes. In alternative embodiments, the metal features 112 and/or the seal ring 130 may be formed by an electroplating process.

For example, the Damascene processes may include patterning the dielectric structure 104 to form openings, such as trenches and/or though-holes (e.g., via holes). A deposition process may be performed to deposit a conductive metal (e.g., copper) in the openings. A planarization process, such as chemical-mechanical planarization (CMP) may then be performed to remove excess copper (e.g., overburden) that is disposed on top of the dielectric structure 104.

In particular, the patterning, metal deposition, and planarizing processes may be performed for each of the ILD layers 104B-104F, in order to form the interconnect structure 110 and/or the seal ring 130. For example, ILD layer 104B may be deposited and patterned to form openings. A deposition process may then be performed to fill the openings in the ILD layer 104B. A planarization process may then be performed to remove the overburden and form metal features 112 in the ILD layer 104B. These process steps may be repeated to form the ILD layers 104C-104F and the corresponding metal features 112, and thereby complete the interconnect structure 110 and/or seal ring 130.

A front side bonding layer 50A may be disposed over the dielectric structure 104. The front side bonding layer 50A may be formed of a dielectric bonding material such as an epoxy resin. A front side bonding pad 52A may be formed in the front side bonding layer 50A. A back side bonding layer 50B may be formed on the back side of the semiconductor substrate 102. However, in some embodiments, the back side bonding layer 50B may be omitted, depending on the intended location of the die 100 within a stack. A back side bonding pad 52B may be formed in the back side bonding layer 50B.

The front side bonding layer 50A and the back side bonding layer 50B may be formed by depositing a bonding material using any suitable deposition method. Suitable bonding materials may include silicon oxide or binding polymers as described above, or the like, such as an epoxy, a polyimide (PI), a benzocyclobutene (BCB), and a polybenzoxazole (PBO). Other suitable bonding materials may be within the contemplated scope of disclosure. The front side bonding pad 52A and the back side bonding pad 52B may be electrically conductive features formed of the same materials as the metal features 112. For example, the front side bonding pad 52A and the back side bonding pad 52B may include tungsten (W), copper (Cu), a copper alloy, aluminum (Al), an aluminum alloy, or a combination thereof, or the like.

A dielectric encapsulation (DE) layer 40 may be formed on side surfaces of the die 100. The DE layer 40 may be formed of a dielectric material, such as silicon oxide, silicon nitride, a molding compound including a resin and a filler, or the like. The DE layer 40 may be formed by any suitable deposition process, such as spin-coating, lamination, deposition, or the like.

The TSV structure 162 may be disposed in a trench formed in the semiconductor substrate 102. The TSV structure 162 may be electrically connected to the interconnect structure 110 and the back side bonding pad 52B. The TSV structure 162 may be formed of suitable electrically conductive material, such as, copper (Cu), a copper alloy, aluminum (Al), an aluminum alloy, silver (Ag), tungsten (W), combinations thereof, or the like. For example, the TSV structure 162 may preferably include copper at an atomic percentage greater than 80%, such as greater than 90% and/or greater than 95%, although greater or lesser percentages of copper may be used. Other suitable electrically conductive materials for use in the TSV 162 are within the contemplated scope of disclosure.

In some embodiments, a barrier layer may be disposed between the TSV structures 162 and the semiconductor substrate 102 and the dielectric structure 104. The barrier layer may include Ta, TaN, Ti, TiN, CoW, or combinations thereof, for example. Other suitable barrier layer materials may be within the contemplated scope of disclosure.

FIG. 2A is a simplified top view of a semiconductor package 10, according to various embodiments of the present disclosure. FIG. 2B is a simplified view of a first side of the semiconductor package 10 of FIG. 2A, and FIG. 2C is a simplified view of a second side of the semiconductor package 10 of FIG. 2A.

Referring to FIGS. 1, 2A, 2B, and 2C, the semiconductor package 10 may include a first die stack 20A, a second die stack 20B, a first connection die 200, and a dielectric encapsulation (DE) layer 40. However, the present disclosure is not limited to any particular number of die stacks. For example, the semiconductor package 10 may include one die stack or more than two die stacks, in some embodiments.

As discussed in detail below, the first connection die 200 may include a planar semiconductor substrate 202 and a first connection die interconnect structure 210 that may be electrically connected to the first die stack 20A. The first connection die interconnect structure 210 may also be electrically connected to the second die stack 20B. Herein, a "plane" of a die may refer to a plane defined by the planar semiconductor substrate of the die. Put another way, the plane of the die substrate defines the plane of the die. As such, the plane of the first connection die 200 (i.e., the plane of the semiconductor substrate 202) may extend in a first horizontal direction H1 and a second horizontal direction H2 perpendicular to the first horizontal direction H1.

The first die stack 20A and the second die stack 20B may each include stacked dies 100 that may be stacked and bonded together. The stacked dies 100 and the first connection die 200 may be independently selected from an application-specific integrated circuit (ASIC) chip, an analog chip, a sensor chip, a wireless and radio frequency chip, a voltage regulator chip, a memory chip, or the like. In some embodiments, the stacked dies 100 may be SRAM chips, and the first connection die 200 may be a SOC passive device.

While the first die stack 20A and the second die stack 20B are shown to include four stacked dies 100, the present disclosure is not limited thereto. For example, the first die stack 20A and/or the second die stack 20B may include from four to 20, or more, stacked dies 100, such as from four to fifteen stacked dies 100, or from four to ten stacked dies 100.

The first die stack 20A and the second die stack 20B may be aligned such that a stacking direction of the stacked dies 100 is perpendicular to the first horizontal direction H1 and the second horizontal direction H2. In other words, the planes of the stacked dies 100 in each of the first die stack 20A and the second die stack 20B may extend in a vertical direction V, perpendicular to the first horizontal direction H1 and the second horizontal direction H2. In other words, the planes of the stacked dies 100 in each of the first die stack 20A and the second die stack 20B may be perpendicular to the plane of the first connection die 200. Accordingly, an angle formed between the plane of each stacked die 100 and the first connection die 200 may be about 90°. However, in other embodiments, the angle formed between the plane of each stacked die 100 and the plane of the first connection die 200 may range from 90° to 45°, in some embodiments.

As discussed in detail below, the orientation of the stacked dies 100 on the first connection die 200 allows for the stacked dies 100 to be electrically connected directly to the first connection die 200, via connection circuits that pass through side walls of the stacked dies 100 and through the first connection die 200. In particular, the semiconductor package 10 may include intra-stack connection circuits 114 that electrically connects stacked dies 100 of the first die stack 20A or the second die stack directly, and inter-stack connection circuits 116 that electrically connect a stacked die 100 of the first die stack 20A with a stacked die 100 of the second die stack 20B directly.

FIG. 3 is a flow chart showing the operations of a method of forming a semiconductor package, according to various embodiments of the present disclosure. FIGS. 4A-4G are cross-sectional views showing intermediate structures as the operations of the method of FIG. 3 may be performed.

Figure 4A:
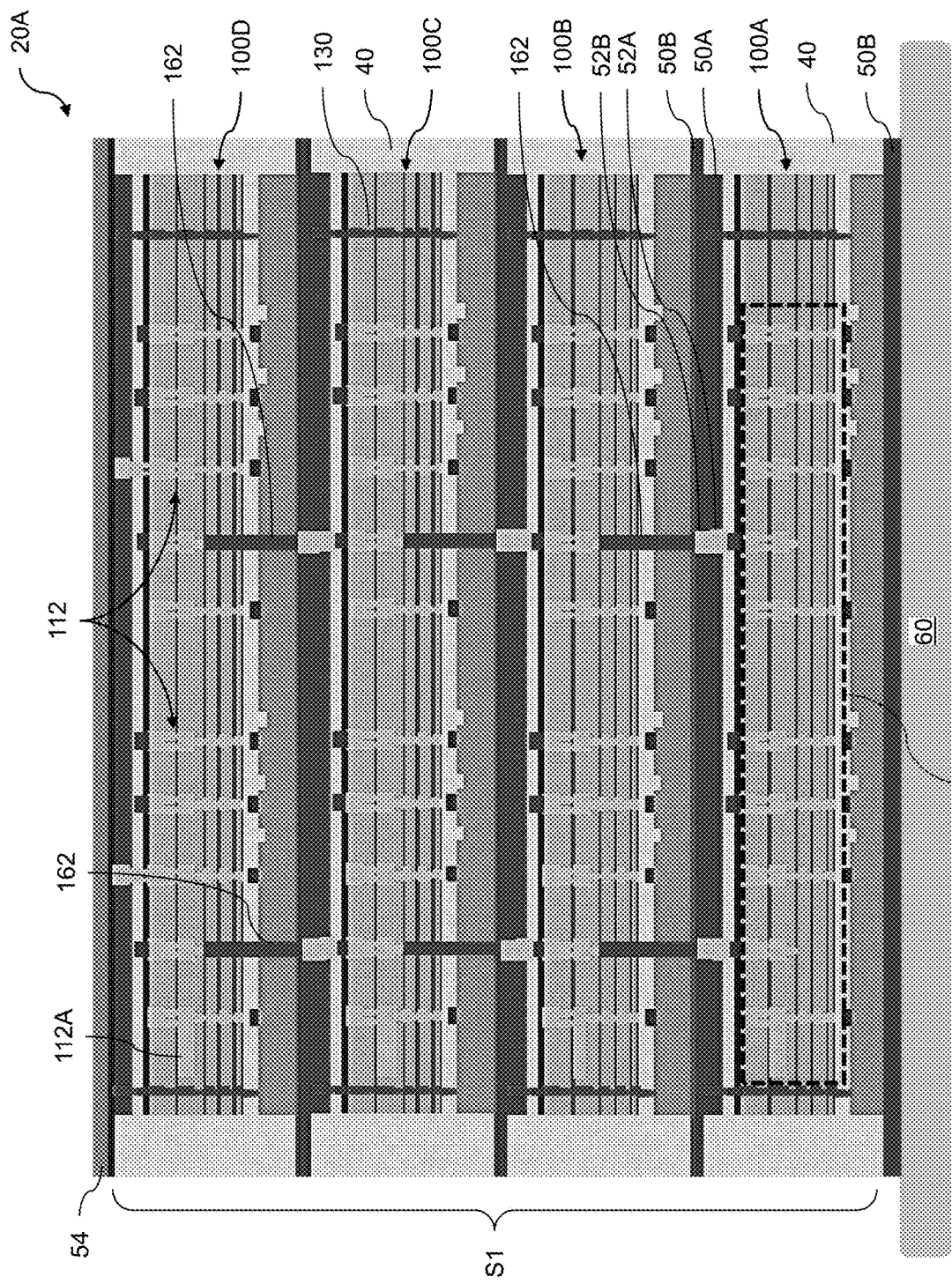
FIGS. 4A-4G are vertical cross-sectional views showing operations of the method of FIG. 3.

Referring to FIGS. 3 and 4A, in operation 702 a first die stack 20A may be formed on a first carrier 60. The first die stack 20A may include multiple stacked dies 100, such as stacked dies 100A-100D. The stacked dies 100A-100D may be, for example, independently selected from an application-specific integrated circuit (ASIC) chip, an analog chip, a sensor chip, a wireless and radio frequency chip, a voltage regulator chip, a memory chip, or the like. While a die stack such as first die stack 20A may include more or fewer dies (e.g., 100A-100D), FIG. 4 illustrates a first die stack with at least four stacked dies 100A-100D.

The stacked dies 100A-100D may be similar to the die 100 of FIG. 1. For example, the stacked dies 100A-100D may each include a semiconductor substrate 102, a dielectric structure 104, an interconnect structure 110 including a first connection line 112A, a seal ring 130, a front side bonding layer 50A, a back side bonding layer 50B, a front side bonding pad 52A, and a back side bonding pad 52B. The stacked dies 100B-100D may include TSV structures 162, in some embodiments. A TSV structure 162 may be omitted from the lowermost stacked die 100A. In addition, some of the stacked dies may not require a front side bonding pad 52A or a back side bonding pad 52B. For example, stacked die 100A does not include a back side bonding pad 52B.

The stacked dies 100A-100D may be stacked on the first carrier 60 and bonded to form the first die stack 20A. In particular, the stacked dies 100A-100D may be aligned such that the first connection lines 112A of the stacked die 100A-100D are disposed adjacent to a first side or first surface S1 of the first die stack 20A.

The stacked dies 100A-100D may be bonded to one another using a hybrid fusion bonding process. In particular, the front side bonding layer 50A and the back side bonding layer 50B of adjacent stacked dies 100A-100D may be bonded using a dielectric-to-dielectric bonding process or a polymer-to-polymer bonding process, and the front side bonding pad 52A, and the back side bonding pad 52B of adjacent stacked dies 100A-100D may be bonded using a metal-to-metal bonding process. The lowermost stacked die 100A may be bonded to the first carrier 60 by the back side bonding layer 50B of the stacked die 100A.

The first carrier 60 may be a silicon wafer, a sapphire wafer, or any other suitable carrier, such as a glass or plastic carrier, for example. A protective layer 54 may be deposited on the uppermost stacked die 100D. The protective layer 54 may include a dielectric material, such as silicon oxide, silicon nitride, silicon oxynitride, or the like.

Operation 702 may include forming additional die stacks on the first carrier 60. For example, the first die stack 20A and a second die stack 20B (see FIG. 4B) may each be formed on the first carrier 60 during the same manufacturing process. As such, the first die stack 20A and the second die stack 20B may have similar components. In other embodiments, the second die stack 20B may be formed on a different carrier and may have different components or a different component configuration than the first die stack 20A.

While the first die stack 20A and the second die stack 20B are shown in various figures to include four stacked dies 100 (e.g., 100A-100D), the present disclosure is not limited to any particular number of stacked dies 100 that may be included in a die stack. For example, the first die stack 20A and/or the second die stack 20B may include more than four stacked dies, such as at least 5, at least 10, at least 15, or at least 20 stacked dies. Fewer or additional dies may be included in the die stack.

Figure 4B:
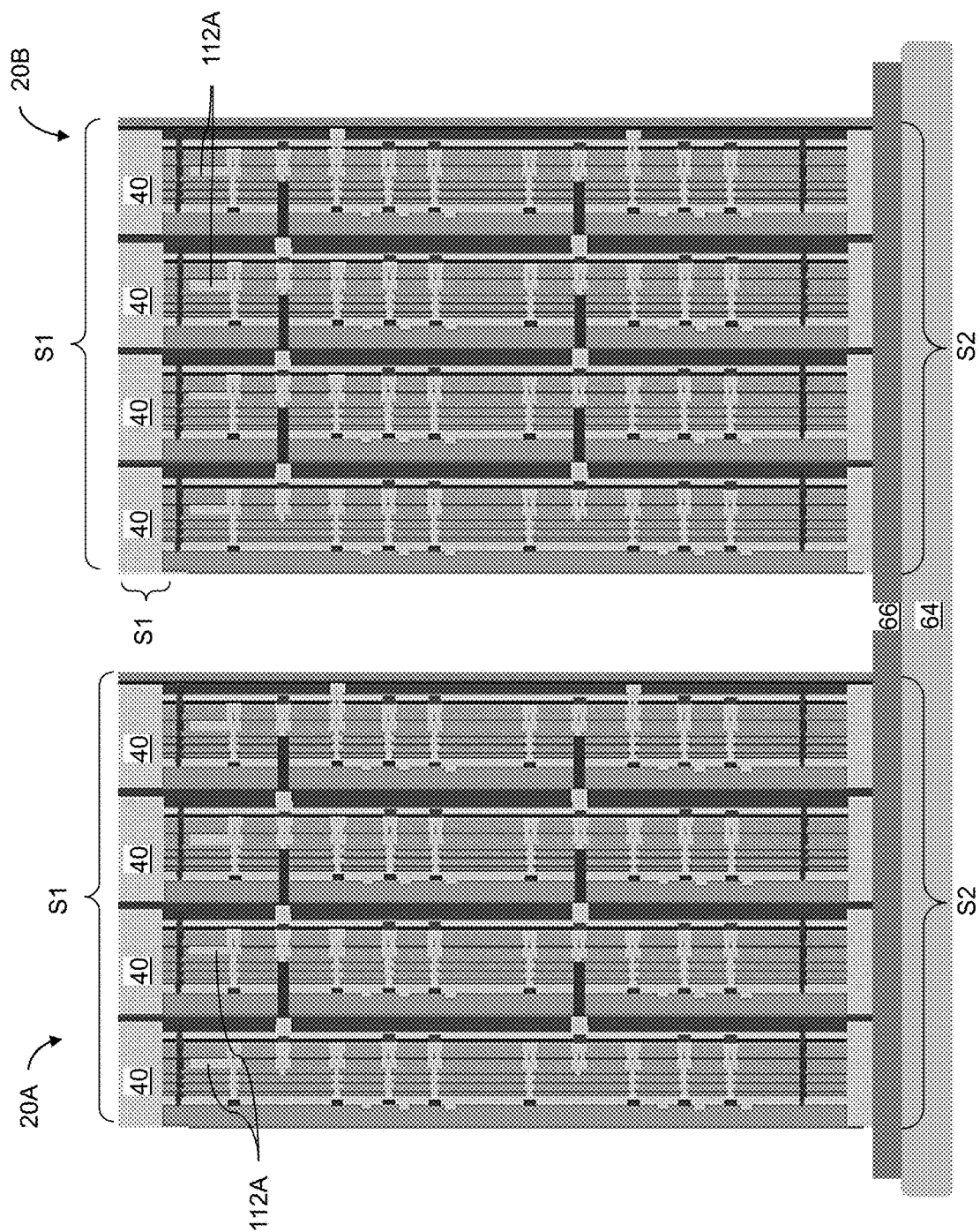

Referring to FIGS. 3 and 4B, in operation 704 the first die stack 20A and the second die stack 20B may be removed from the first carrier 60, rotated 90°, and bonded to a second carrier 64 by a carrier bonding layer 66. In particular, second sides (or second surfaces) S2 of the first die stack 20A and the second die stack 20B, which may be opposite to the first sides (or first surfaces) S1 of the first die stack 20A and the second die stack 20B, may be bonded to the second carrier 64, such that the first sides (or first surfaces) S1 are exposed above the second carrier 64. In some embodiments, the carrier bonding layer 66 may be a vertical fusion bump or the like.

Figure 4C:
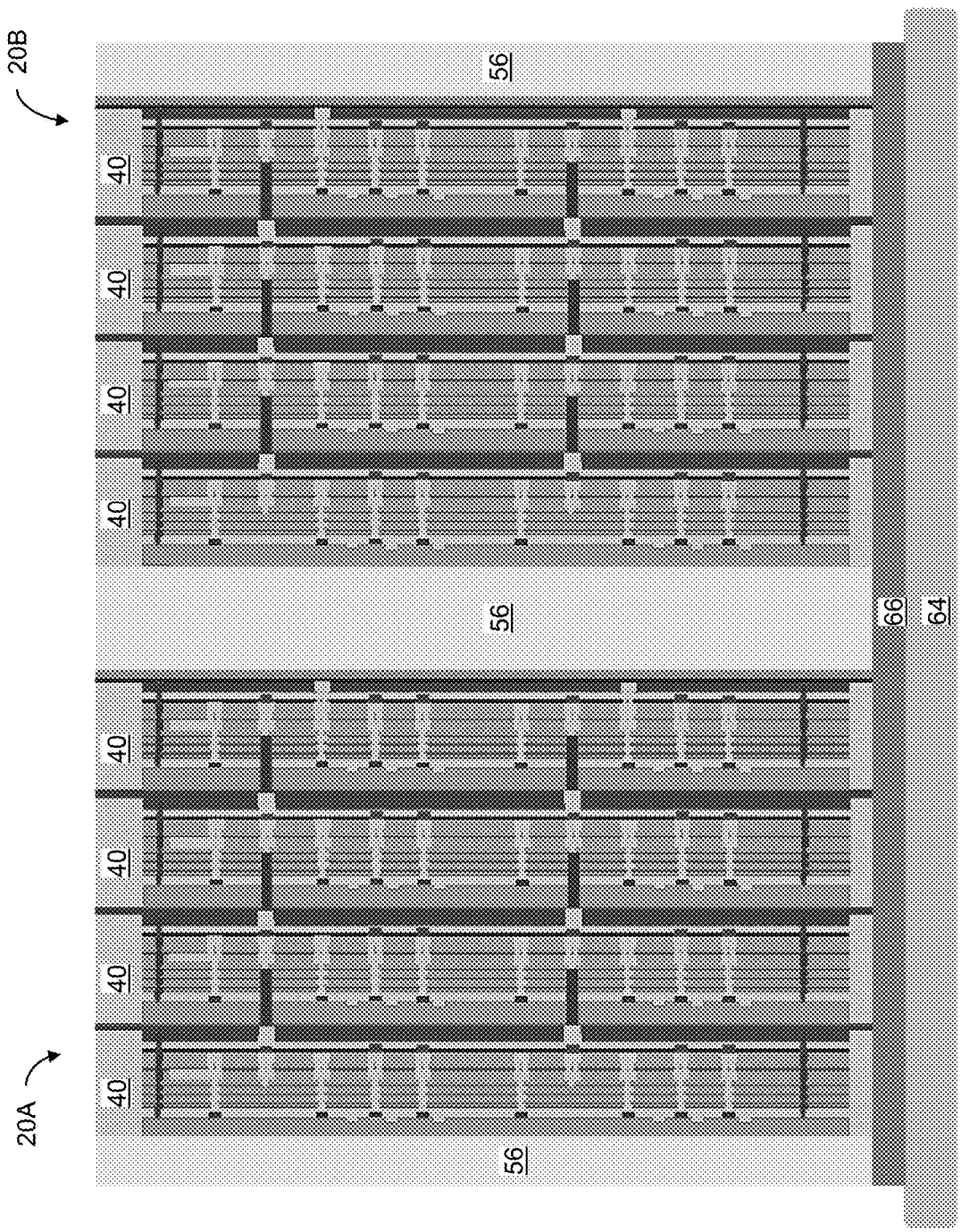

Referring to FIGS. 3 and 4C, in operation 706 a dielectric fill layer 56 may be deposited around and between the first die stack 20A and the second die stack 20B. The dielectric fill layer 56 may be deposited using any suitable deposition method and may include any suitable dielectric material, such as silicon oxide, silicon nitride, or the like. Other suitable dielectric materials are within the contemplated scope of disclosure.

Figure 4D:
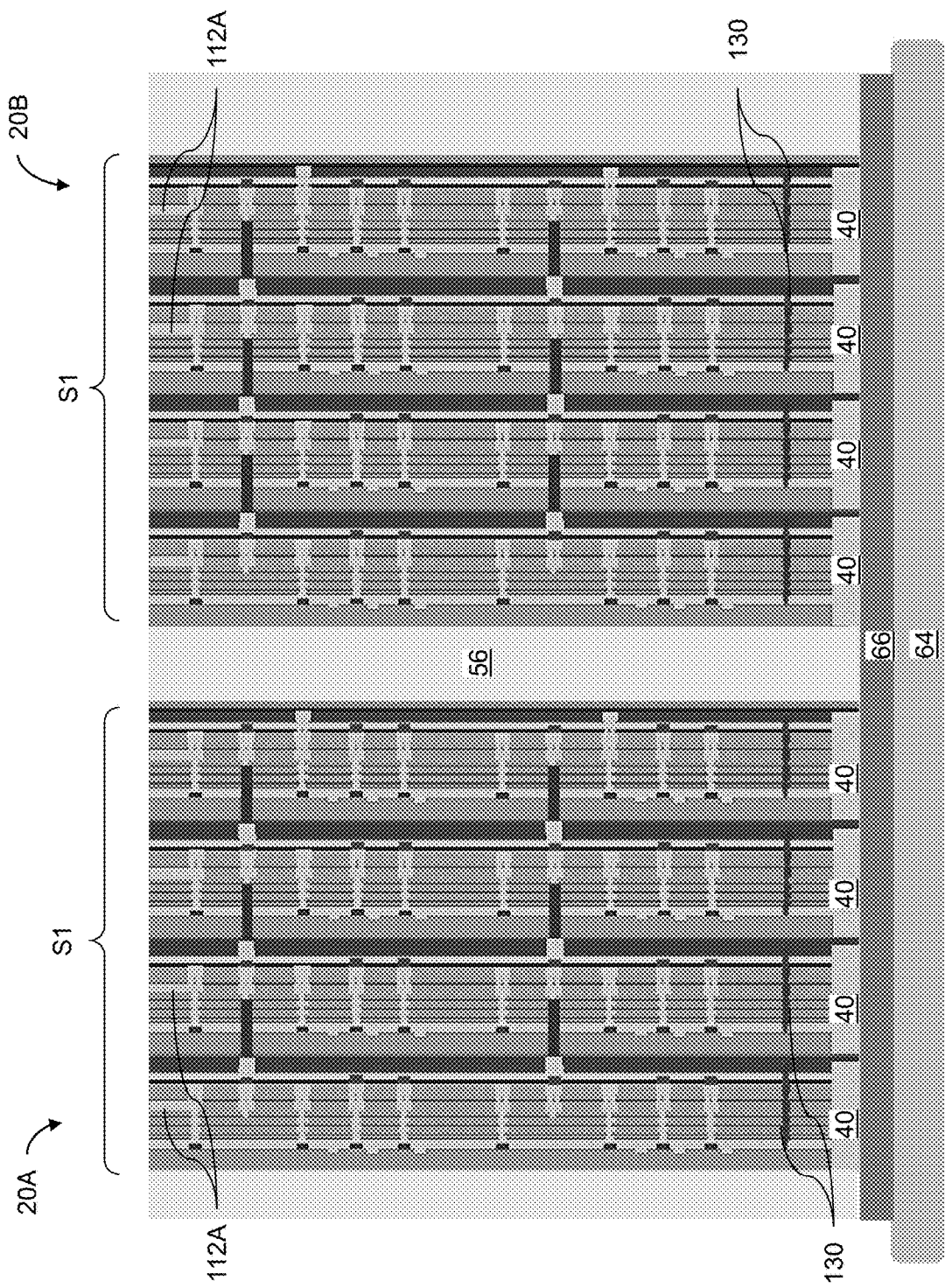

Referring to FIGS. 3 and 4D, in operation 708 a planarization process, such as chemical mechanical planarization (CMP) may be performed on the first side S1 of the first die stack 20A, first side S1 of the second die stack 20B, and the dielectric fill layer 56. In particular, the first die stack 20A and the second die stack 20B may be polished to remove portions of the DE layers 40 and the seal rings 130, such that the first connection lines 112A may be exposed on the first sides S1 of the first die stack 20A and the second die stack 20B.

Figure 4E:
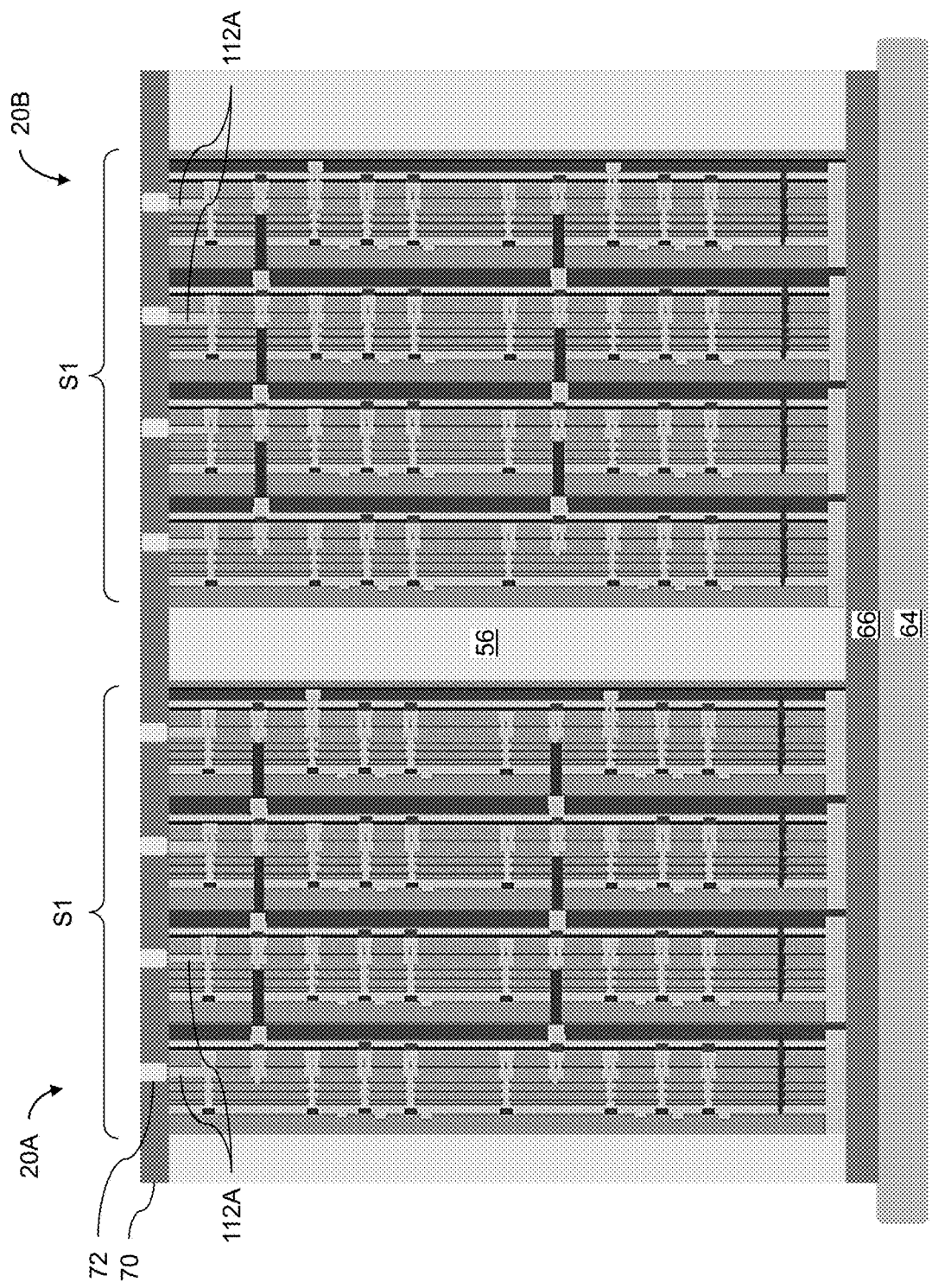

Referring to FIGS. 3 and 4E, in operation 710 a connection bonding layer 70 and connection bonding pads 72 may be formed on the first sides S1 of the first die stack 20A and the second die stack 20B, and on the dielectric fill layer 56. The connection bonding layer 70 may include a bonding material deposited on the front side and the back side of the die 100. Suitable bonding materials may include silicon oxide or binding polymers, such as an epoxy, a polyimide (PI), a benzocyclobutene (BCB), and a polybenzoxazole (PBO). Other suitable bonding materials may be within the contemplated scope of disclosure. The connection bonding pads 72 may be electrically conductive features formed of the same materials as the first connection lines 112A. For example, the connection bonding pads 72 may include tungsten (W), copper (Cu), a copper alloy, aluminum (Al), an aluminum alloy, or a combination thereof, or the like. Other suitable conductive metal materials for use as the connection bonding pads are within the contemplated scope of disclosure.

The connection bonding layer 70 and connection bonding pads 72 may be formed using a hybrid bonding process. As such, the connection bonding pads 72 may be fused to the first connection lines 112A, and the connection bonding layer 70 may be bonded to the dielectric fill layer 56 and to underlying dielectric layers of the first die stack 20A and the second die stack 20B.

Figure 4F:
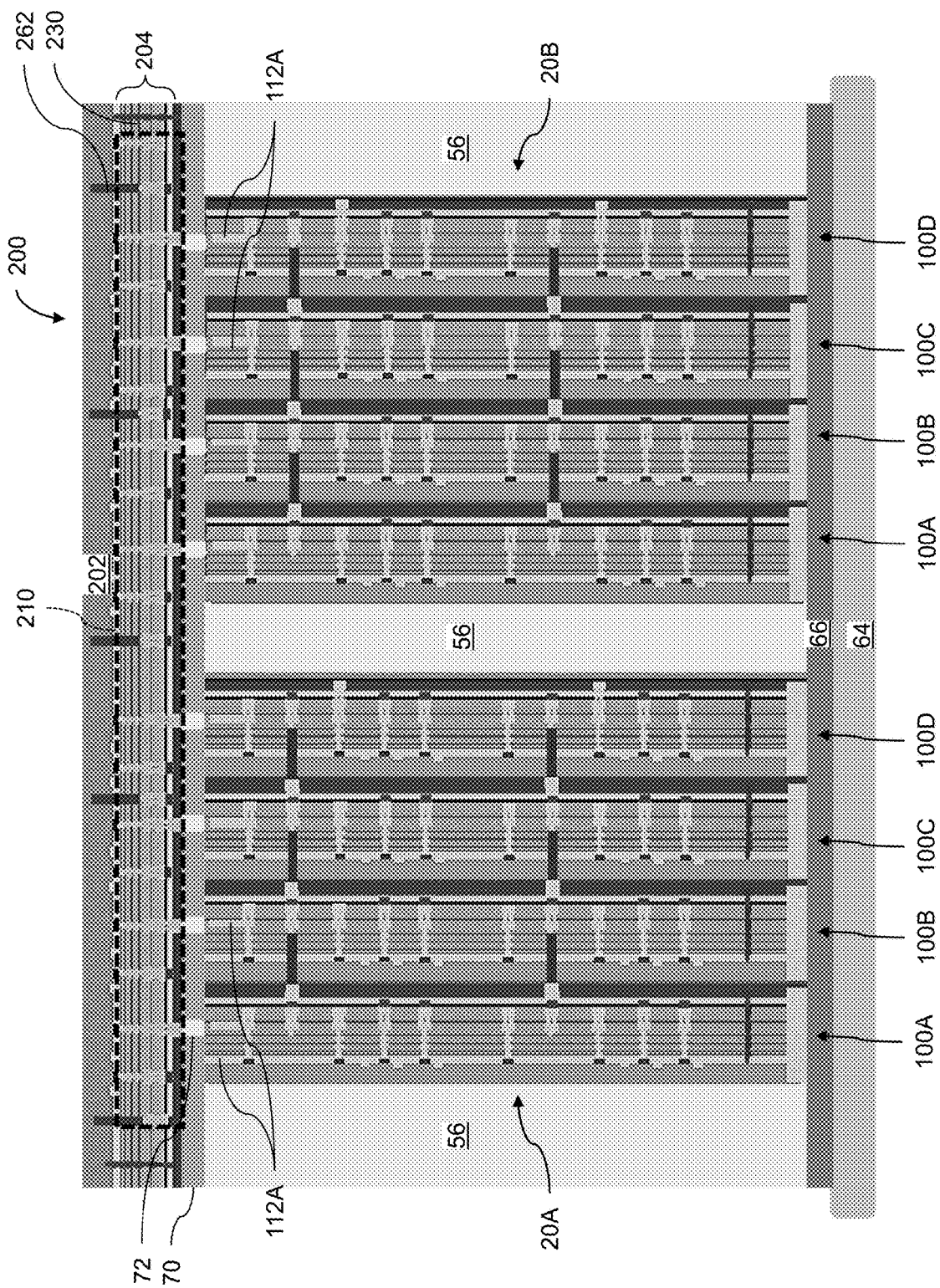

Referring to FIGS. 3 and 4F, in operation 712 a first connection die 200 may be bonded to the connection bonding layer 70 and the connection bonding pads 72, using any suitable bonding process, such as a hybrid bonding process. The first connection die 200 may be similar to the die 100 of FIG. 1. For example, the first connection die 200 may include a semiconductor substrate 202, a dielectric structure 204, an interconnect structure 210, a seal ring 230, and TSV structures 262. In some embodiments, the first connection die 200 may be a passive component (e.g., the semiconductor substrate 202 may not include a device layer).

The interconnect structure 210 may be formed of electrically conductive metal lines and via structures, as described above with respect to the interconnect structure 110. The interconnect structure 210 may be configured to directly electrically connect non-adjacent stacked dies 100A-100D of the first die stack 20A, and to electrically connect adjacent and/or non-adjacent stacked dies 100A-100D of the second die stack 20B directly to one another through intra-stack connection circuits 114. In some embodiments, the interconnect structure 210 may be configured to electrically connect one or more stacked dies 100A-100D of the first die stack 20A to one or more stacked dies 100A-100D of the second die stack 20B directly through an inter-stack connection circuit 116. Herein, the stacked dies 100A-100D of the first die stack 20A may be referred to as "first stacked dies", and the stacked dies 100A-100D of the second die stack 20B may be referred to as "second stacked dies".

Figure 4G:
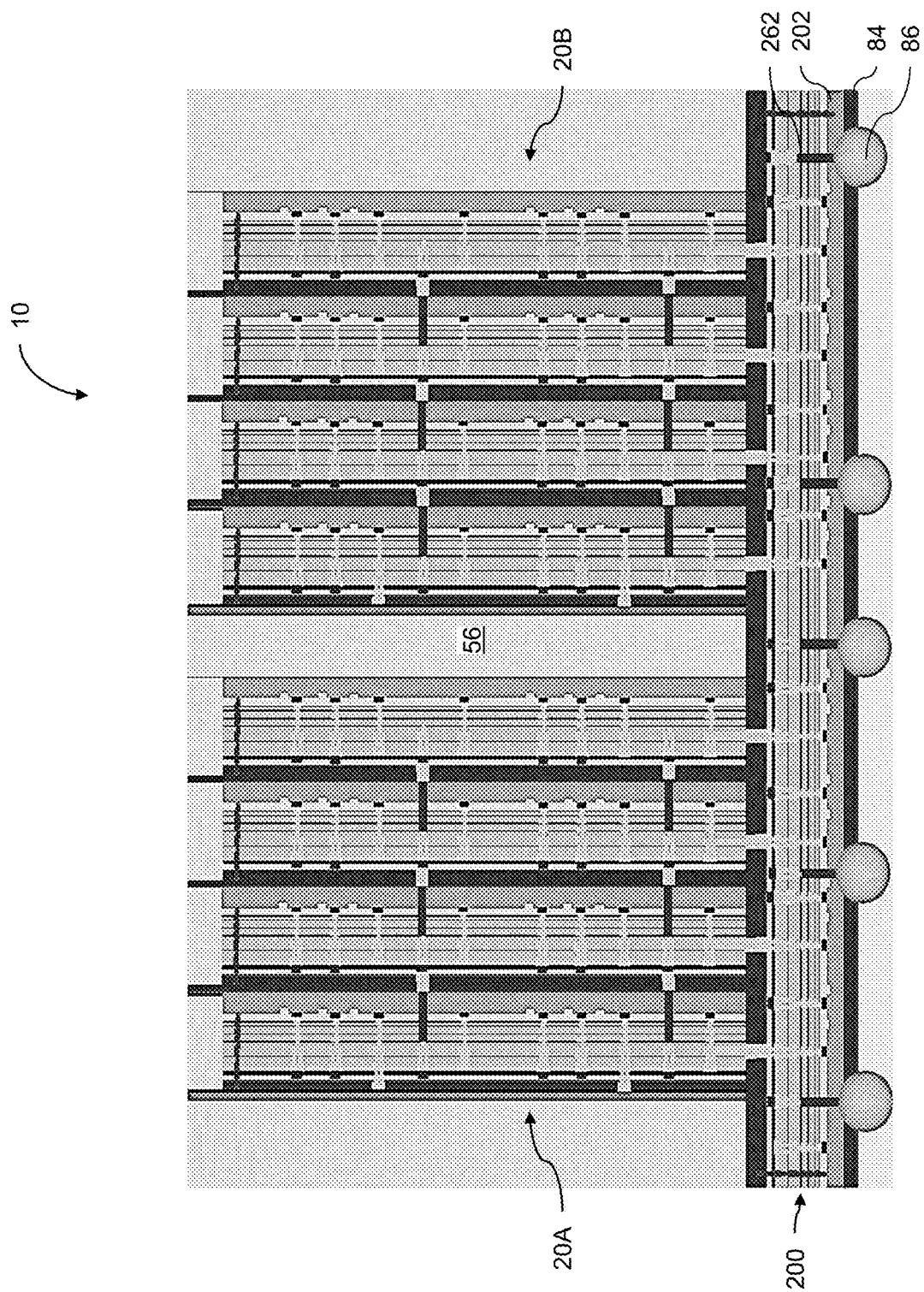

Referring to FIGS. 3 and 4G, in operation 714 the semiconductor substrate 202 of the first connection die 200 may be thinned to expose the TSV structures 262 formed therein. A dielectric layer 84 and electrical contacts 86, such as solder bumps, may be formed on a back side of the semiconductor substrate 202. The electrical contacts 86 may be electrically connected to the exposed TSV structures 262. The second carrier 64 may be removed, and the first die stack 20A, the second die stack 20B, and the first connection die 200 may be inverted to form a semiconductor package 10 as shown in FIG. 4G.

Figure 5:
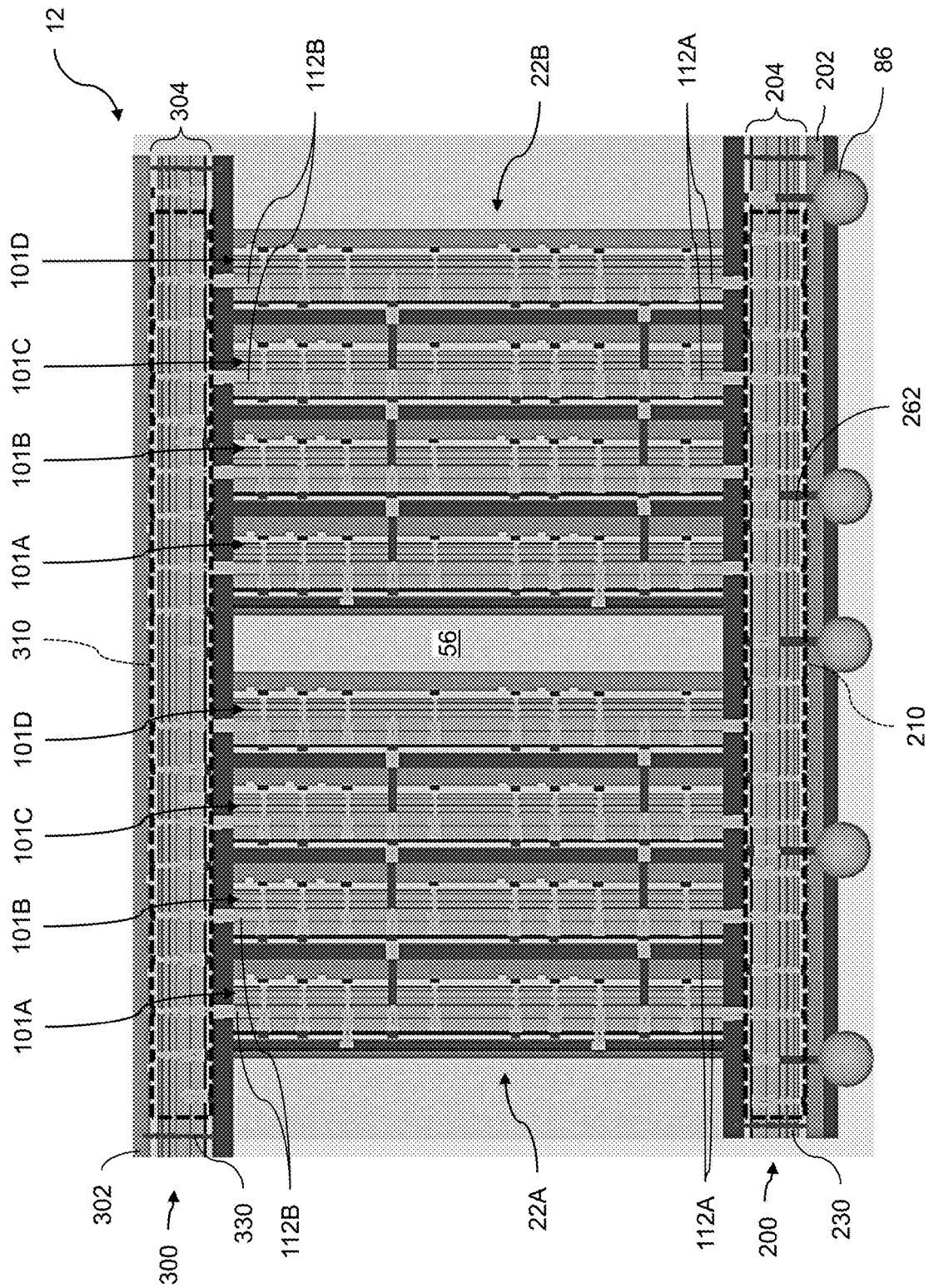
FIG. 5 is a cross-sectional view of a semiconductor package, according to various embodiments of the present disclosure.

FIG. 5 is a cross-sectional view of a semiconductor package 12, according to various embodiments of the present disclosure. The semiconductor package 12 may be a modified version of the semiconductor package 10 shown in FIG. 4G. As such, like reference numbers refer to like elements, and only the differences there between will be described in detail.

Referring to FIG. 5, the semiconductor package 12 may include a first die stack 22A, a second die stack 22B and a first connection die 200. In contrast to the semiconductor package 10, the semiconductor package 12 may also include a second connection die 300, with the first connection die 200 and the second connection die 300 being disposed on opposing side of the first die stack 22A and the second die stack 22B.

The first die stack 22A and the second die stack 22B may each include stacked dies 101A-101D. The stacked dies 101A-101D may be similar to the die 100 of FIG. 1. For example, the stacked dies 101A-101D may each include a semiconductor substrate 102, a dielectric structure 104, and an interconnect structure 110 including a first connection line 112A and a second connection line 112B (see FIG. 1). The first connection lines 112A and the second connection lines 112B may be disposed on opposing sides of the first die stack 22A and on opposing sides of the second die stack 22B.

The first connection die 200 may be similar to the first connection die 200 of the semiconductor package 10. For example, the first connection die 200 may include a semiconductor substrate 202, a dielectric structure 204, an interconnect structure 210, a seal ring 230, and TSV structures 262.

The second connection die 300 may be similar to the first connection die 200. For example, the second connection die 300 may include a semiconductor substrate 302, a dielectric structure 304, an interconnect structure 310, and a seal ring 330. The second connection die 300 may be a passive component, in some embodiments.

The interconnect structure 210 may be electrically connected to the first connection lines 112A, and the interconnect structure 310 may be electrically connected to the second connection lines 112B. The first connection die 200 and the second connection die 300 may be configured to electrically connect non-adjacent stacked dies 101A-101D of the same die stack 22A, 22B directly to one another via intra-stack connection circuits 114, or directly to stacked dies 101A-101D of different die stacks 22A, 22B via inter-stack connection circuits 116. In particular, the interconnect structure 210 and the first connection lines 112A may form die connection circuits, and the interconnect structure 310 and the second connection lines 112B may form die connection circuits.

Figure 6:
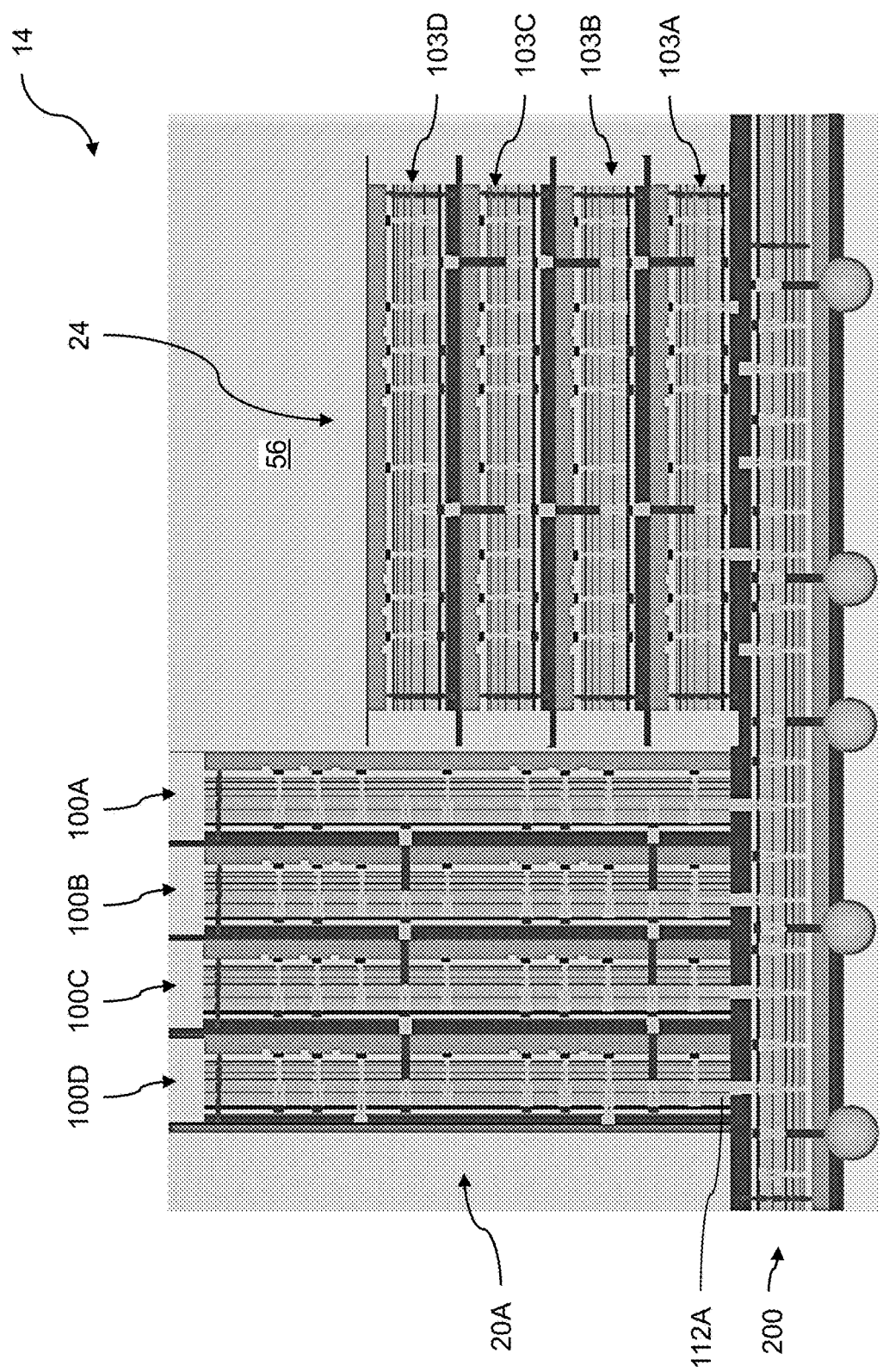
FIG. 6 is a cross-sectional view of a semiconductor package, according to various embodiments of the present disclosure.

FIG. 6 is a cross-sectional view of a semiconductor package 14, according to various embodiments of the present disclosure. The semiconductor package 14 may include elements similar to the elements of the semiconductor package 10. As such, like reference numbers refer to like elements, and only the differences there between will be described in detail.

Referring to FIG. 6, the semiconductor package 14 may include a first die stack 20A and a second die stack 24, disposed on a first connection die 200. The first die stack 20A and the first connection die 200 may be similar to the first die stack 20A and the first connection die 200 of the semiconductor package 10. In particular, the first die stack 20A may include stacked dies 100A-100D that are electrically connected to the first connection die 200 by first connection lines 112A.

The second die stack 24 may include stacked dies 103A-103D that are similar to the die 100 of FIG. 1, except that the stacked dies 103A-104D do not include connection lines (e.g., 112A, 112B). The stacked dies 103A-104D may be electrically connected to one another by TSV structures 162 and may be electrically connected to the first connection die 200. The second die stack 24 may be oriented on the first connection die 200, such that planes of the stacked dies 103A-103D may be parallel to the plane of the first connection die 200. As such, the planes of the stacked dies 103A-103D may be perpendicular to the planes of the stacked dies 100A-100D.

Various embodiments of the present disclosure provide semiconductor packages 10 that include die stacks 20A, 20B disposed on at least one connection die 200. The die stacks 20A, 20B include stacked dies 100A-100D, with the planes of the stacked dies 100A-100D being aligned at an angle that range from about 45° to about 90 with respect to a plane of a connection die 200. The connection die 200 may electrically connect the stacked dies 100A-100D directly to one another, in order to reduce circuit resistance. Thus, the number of stacked dies 100A-100D may be increased, without suffering from increased circuit resistance due to indirectly connecting the stacked dies using TSV structures 162.

Various embodiments provide a semiconductor package 10 may include: a first connection die 200 comprising a semiconductor substrate 202 and an interconnect structure 210; and a first die stack 20A disposed on the first connection die 200 and comprising stacked dies 100, each of the stacked dies 100 comprising a semiconductor substrate 102 and an interconnect structure 110 that may include a first connection line 112A that is electrically connected to the interconnect structure 210 of the first connection die 200, wherein an angle formed between a plane of the first connection die 200 and a plane of each stacked die 100 ranges from about 45° to about 90°.

In one embodiment, the interconnect structure 210 of the first connection die 200 may electrically connect the first connection lines 112A of at least two of the stacked dies 100A-100D directly to one another. In one embodiment, the semiconductor substrate 102 of each stacked die 100A-100D each defines the plane of each stacked die 100A-100D; the semiconductor substrate 202 of the first connection die 200 defines the plane of the first connection die 200; and the planes of the stacked dies 100A-100D may be perpendicular to the plane of the first connection die 200. In one embodiment, the stacked dies 100A-100D may include memory chips; and the first connection die 200 may be a passive component. In one embodiment, the first die stack 20B may include at least five of the stacked dies. In one embodiment, the first die stack 20A, 20B may include a first side S1 that may be bonded to the first connection die 200 and an opposing second side S2; and the first connection lines 112A may be exposed on the first side S1 of the first die stack 20A, 20B. In one embodiment, the semiconductor package 10, 12 may also include a second connection die 300 bonded to the second side S2 of the first die stack, the second connection die 300 may include a semiconductor substrate 302 and an interconnect structure 310, wherein the interconnect structures 110 of the stacked dies 100A-100D each comprise a second connection line 112B that may be exposed on the second side S2 of the first die stack 20B and that may be electrically connected to the interconnect structure 310 of the second connection die 300. In one embodiment, the semiconductor package 10, 12 may also include a second die stack 20B disposed on the first connection die 200 and may include stacked dies 100A-100D, each of the stacked dies 100A-100D may include a semiconductor substrate 102 and an interconnect structure 110 that may include a first connection line 112A that may be electrically connected to the interconnect structure 210 of the first connection die 200. In one embodiment, a plane of each stacked die 100A-100D of the second die stack 20B may be parallel to the plane of the first connection die 200. In one embodiment, a plane of each stacked die 100A-100D of the second die stack 20B may be perpendicular to the plane of the first connection die 200.

Various embodiments provide a semiconductor package 10 may include a first connection die 200 that may include a semiconductor substrate 202 and an interconnect structure 210; a first die stack 20A disposed on the first connection die 200 and may include first stacked dies 100, each of the first stacked dies 100 may include a semiconductor substrate 102 and an interconnect structure 110 that may include a first connection line 112A that is electrically connected to the interconnect structure 210 of the first connection die 200; and a second die stack 20B disposed on the first connection die 200 and may include second stacked dies 100, each of the second stacked dies may include a semiconductor substrate 102 and an interconnect structure 110 may include a first connection line 112A that is electrically connected to the interconnect structure 210 of the first connection die 200, wherein a plane of the first connection die 200 is perpendicular to a plane of each first stacked die.

In one embodiment, the semiconductor substrate 102 of each first stacked die 100A-100D defines the plane of each first stacked die 100A-100D; and the semiconductor substrate 202 of the first connection die 200 defines the plane of the first connection die 200. In one embodiment, a plane of each second stacked die 20B may be parallel to the plane of the first connection die 200. In one embodiment, a plane of each second stacked die 20B may be perpendicular to the plane of the first connection die 200. In one embodiment, the interconnect structure 210 of the first connection die 200 electrically connects the first connection lines 112A of at least two of the first die stacks 20A directly; and the interconnect structure 210 of the first connection die 200 electrically connects the first connection lines 112A of at least two of the second die stacks 20B directly. In one embodiment, the first die stacks 20A and the second die stacks 20B may include memory chips; and the first connection die 200 may be a passive component. In one embodiment, the first die stack 20A may include a first side S1 that may be bonded to the first connection die 200 and an opposing second surface S2; the first connection lines 112A of the first die stacks 20A may be exposed on the first side S1 of the first die stack 20A; the second die stack 20B may include a first side S1 that may be bonded to the first connection die 200 and an opposing second side S2; and the first connection lines 112A of the second die stacks 20B may be exposed on the first side S1 of the second die stack 20B. In one embodiment, the semiconductor package 10, 12 may further include a second connection die 300 bonded to the second side of the first die stack 20A and the second side of the second die stack 20B, the second connection die 300 may include a semiconductor substrate 302 and an interconnect structure 310, wherein the interconnect structures 110 of the first die stacks 20A each may include a second connection line 112B that may be exposed on the second side S2 of the first die stack 20A and that may be electrically connected to the interconnect structure 310 of the second connection die 300, and wherein the interconnect structures 110 of the second die stacks 20B each may include a second connection line 112B that may be exposed on the second side S2 of the second die stack 20B and that may be electrically connected to the interconnect structure 310 of the second connection die 300.

Various embodiments further provide a method of manufacturing a semiconductor package 10, that may include: bonding stacked dies 100 to form a first die stack 20A, each of the stacked dies 100 may include a semiconductor substrate 102 and an interconnect structure 110 may include a first connection line 112A; planarizing a first side S1 of the first die stack 20A to expose the first connection lines 112A; and bonding the first side S1 of the first die stack 20A to a first connection die 200 may include a semiconductor substrate 202 and an interconnect structure 210, such that the first connection lines 112A are electrically connected to the interconnect structure 210 of the first connection die 200, wherein an angle formed between a plane of the first connection die 200 and a plane of each stacked die 100 ranges from about 45° to about 90°.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor package, comprising:

bonding first dies to one another to form a first die stack having a first side and an opposing second side, each of the first dies comprising:
- a planar first semiconductor substrate having a front side and an opposing back side that defines a plane of the first die; and
- a first interconnect structure disposed on the front side of the first semiconductor substrate and comprising a first connection line and a second connection line;

planarizing the first side of the first die stack to expose the first connection lines; and bonding the first side of the first die stack to a first connection die, such that the first connection lines are electrically connected to the first connection die, the first connection die comprising:
- a planar first connection substrate having a front surface and an opposing back surface that defines a plane of the first connection die; and
- a first connection interconnect structure disposed on the front surface of the first connection substrate and electrically connected to the first connection lines;

planarizing the second side of the first die stack to expose the second connection lines; and bonding a second connection die to the second side of the first die stack, such that the second connection lines are electrically connected to a second connection interconnect structure of the second connection die, wherein an angle formed between the plane of each first die and the plane of the first connection die ranges from about 45° to about 90°.

2. The method of claim 1, wherein:
the first dies each comprise a seal ring surrounding the first interconnect structure; and
the planarizing of the first side and the second side of the first die stack comprises removing portions of each seal ring to expose the first connection lines and the second connection lines.

3. The method of claim 1, wherein:
the first die stack comprises at least five of the first dies; and
the first connection interconnect structure electrically interconnects at least two of the first dies.

4. The method of claim 1, wherein:
the first dies comprise memory chips; and
the first connection die is a passive component.

5. The method of claim 1, wherein:
the second connection die comprises a planar second connection substrate having a front side upon which the second connection interconnect structure is disposed and an opposing a back side that defines a plane of the second connection die; and the plane of the second connection die is parallel to the plane of the first connection die.

6. The method of claim 1, further comprising:
bonding second dies to one another to form a second die stack having a first side and an opposing second side, each of the second dies comprising:
- a planar second semiconductor substrate having a front side and an opposing back side that defines a plane of the second die; and
- a second interconnect structure disposed on the front side of the second semiconductor substrate and comprising a third connection line;

planarizing the first side of the second die stack to expose the third connection lines; and bonding the first side of the second die stack to the first connection die, such that the third connection lines are electrically connected to the first connection interconnect structure, wherein an angle formed between the plane of each second die and the plane of the first connection die ranges from about 45° to about 90°.

7. The method of claim 6, wherein
the second interconnect structures each comprise a fourth connection line.

8. The method of claim 7, further comprising:
planarizing the second side of the second die stack to expose the fourth connection lines; and
bonding the second connection die to the second side of the second die stack, such that the fourth connection lines are electrically connected to a second connection interconnect structure of the second connection die.

9. The method of claim 8, wherein:
the second connection die comprises a planar second connection substrate having a front side upon which the second connection interconnect structure is disposed and an opposing a back side that defines a plane of the second connection die; and
the plane of the second connection die is parallel to the plane of the first connection die.

10. The method of claim 9, wherein the respective planes of the first dies and the respective planes of second dies are perpendicular to the plane of the first connection die and the plane of the second connection die.

11. The method of claim 9, wherein:
the first connection interconnect structure electrically interconnects at least two of the first dies and at least two of the second dies; or
the second connection interconnect structure electrically interconnects at least two of the first dies and at least two of the second dies.

* * * * *